(12) United States Patent
Graf et al.

(10) Patent No.: US 9,972,606 B2
(45) Date of Patent: May 15, 2018

(54) THREE-DIMENSIONAL HYBRID PACKAGING WITH THROUGH-SILICON-VIAS AND TAPE-AUTOMATED-BONDING

(71) Applicant: GLOBALFOUNDRIES INC., Grand Cayman OT (KY)

(72) Inventors: Richard S. Graf, Gray, ME (US); Sebastian T. Ventrone, South Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/604,803

(22) Filed: May 25, 2017

(65) Prior Publication Data

US 2017/0271309 A1 Sep. 21, 2017

Related U.S. Application Data

(62) Division of application No. 14/994,289, filed on Jan. 13, 2016, now Pat. No. 9,741,695.

(51) Int. Cl.
| | |
|---|---|
| *H01L 23/48* | (2006.01) |
| *H01L 23/52* | (2006.01) |
| *H01L 29/40* | (2006.01) |
| *H01L 25/065* | (2006.01) |
| *H01L 25/00* | (2006.01) |
| *H01L 29/41* | (2006.01) |
| *H01L 23/495* | (2006.01) |
| *H01L 23/482* | (2006.01) |

(52) U.S. Cl.
CPC .......... *H01L 25/0657* (2013.01); *H01L 23/48* (2013.01); *H01L 23/482* (2013.01);
(Continued)

(58) Field of Classification Search
CPC ..... H01L 25/0657; H01L 25/00; H01L 25/50; H01L 25/065; H01L 23/48; H01L 23/482; H01L 23/495; H01L 29/40; H01L 29/41
(Continued)

(56) References Cited

U.S. PATENT DOCUMENTS

| | | | |
|---|---|---|---|
| 7,498,668 B2 | 3/2009 | Kawabata et al. | |
| 7,531,905 B2 * | 5/2009 | Ishino | ...... H01L 24/73 257/686 |

(Continued)

OTHER PUBLICATIONS

Office Action Communication, U.S. Appl. No. 14/994,289, dated Sep. 22, 2016, pp. 1-6.
(Continued)

*Primary Examiner* — Dao H Nguyen
(74) *Attorney, Agent, or Firm* — Gibb & Riley, LLC; Michael J. LeStrange, Esq.

(57) ABSTRACT

A 3-dimensional hybrid package including an integrated circuit chip stack formed on a laminate, the integrated chip stack further including a first chip and a second chip. The first chip is connected to the laminate through first solder bumps, each associated with a first through-silicon via (TSV), and first metal leads embedded in a first polymer tape that extends from first peripheral metal pads formed on a back side of the first chip to the laminate. The second chip is connected to the first peripheral metal pads on the back side of the first chip through second solder bumps formed on a front side of the second chip. The second chip is connected to the laminate by second metal leads, embedded in a second polymer tape that extend from second peripheral metal pads formed on a back side of the second chip to the laminate.

20 Claims, 7 Drawing Sheets

(52) U.S. Cl.
CPC ............ *H01L 23/495* (2013.01); *H01L 25/00* (2013.01); *H01L 25/065* (2013.01); *H01L 25/50* (2013.01); *H01L 29/40* (2013.01); *H01L 29/41* (2013.01); *H01L 2225/06513* (2013.01); *H01L 2225/06541* (2013.01); *H01L 2225/06579* (2013.01)

(58) Field of Classification Search
USPC ............... 257/621, 686, 737, 738, 774, 777, 257/E21.137, E21.159, E21.597, E23.021, 257/E23.023, E27.144, E27.161, E29.112; 438/107, 109, 122, 667
See application file for complete search history.

(56) References Cited

U.S. PATENT DOCUMENTS

| | | | |
|---|---|---|---|
| 8,138,017 B2 | 3/2012 | Chin | |
| 8,198,716 B2* | 6/2012 | Periaman | H01L 24/73 |
| | | | 257/686 |
| 8,390,109 B2 | 3/2013 | Popovic et al. | |
| 8,941,246 B2* | 1/2015 | Miura | H01L 27/115 |
| | | | 257/686 |
| 9,343,432 B2 | 5/2016 | Lee et al. | |
| 2010/0314730 A1 | 12/2010 | Labeeb | |
| 2011/0115085 A1* | 5/2011 | Kuwabara | H01L 21/563 |
| | | | 257/738 |
| 2011/0169171 A1 | 7/2011 | Marcoux | |
| 2011/0298097 A1* | 12/2011 | Sueyoshi | H01L 21/76898 |
| | | | 257/621 |
| 2012/0049354 A1 | 3/2012 | Sawayama et al. | |
| 2013/0175706 A1 | 7/2013 | Choi et al. | |
| 2014/0035161 A1 | 2/2014 | Yoshida et al. | |

OTHER PUBLICATIONS

Office Action Communication, U.S. Appl. No. 14/994,289, dated Nov. 3, 2016, pp. 1-14.
Office Action Communication, U.S. Appl. No. 14/994,289, dated Apr. 6, 2017, pp. 1-11.
Notice of Allowance Communication, U.S. Appl. No. 14/994,289, dated May 15, 2017, pp. 1-7.

* cited by examiner

THREE-DIMENSIONAL HYBRID PACKAGING WITH THROUGH-SILICON-VIAS AND TAPE-AUTOMATED-BONDING

CROSS-REFERENCE TO RELATED APPLICATIONS

This application claims the benefit under 35 U.S.C. § 120, as a divisional of U.S. patent application Ser. No. 14/994,289 filed on Jan. 13, 2016, issued as U.S. Pat. No. 9,741,695 on Aug. 22, 2017, the entire teachings of which are incorporated herein by reference.

BACKGROUND

Field of the Invention

The present disclosure generally relates to a three-dimensional (3D) package including multiple integrated circuit (IC) chips, stacked one atop the other, on a laminate and a method of fabricating a hybrid 3D package including the hybrid processes of forming through-silicon-vias (TSVs) in each stacked IC chip and of tape automated bonding (TAB) from at least one stacked chip to the laminate.

Description of Related Art

A three-dimensional (3D) package contains two or more integrated circuit (IC) chips stacked vertically, so as to occupy less space and provide greater connectivity between IC chips. It can, however, be difficult to obtain low-cost, high-performance electrical connections between stacked IC chips. For example, IC chips can be electrically coupled using wire bonds between exposed bond pads on surfaces of a stack of chips, in which the chips are offset from one another to define a staircase of chip edges. But while these wire bonds can be implemented using low-cost assembly techniques, the resulting wire bonds typically have a higher resistance and lower bandwidth for signal transmission due to their length.

In contrast, through-silicon-vias (TSVs) typically have a lesser length and higher bandwidth for signal transmission when compared to wire bonds. In a TSV fabrication process, an IC chip is fabricated so that one or more of the metal layers on its active side is electrically connected to pads on its back side. Multiple IC chips are then adhesively connected in a stack, so that the pads on the back side of one chip make electrical contact with corresponding pads on the active side of an overlying chip.

However, a disadvantage of stacked IC chips with TSVs can include the large number of TSVs required for the transmission of I/O signals from the topmost chip or an upper level chip to the underlying laminate base or a lower level chip that requires a pathway of TSVs through all of the intervening chips. In addition, the efficient distribution of power/ground to upper level chips from the underlying laminate base also suffers from transmission losses through the pathways of TSVs, each of which includes the TSVs of each of the intervening chips in the stack.

Tape automated bonding (TAB) is a method for efficiently and simultaneously connecting a number of bonding pads on an IC chip to external circuitry. TAB has several advantages over wire bonding technology, including: smaller bonding pads; smaller on-chip bonding pitch; a decreased amount of solder for bonding; uniform bond geometry; and increased production rate through "gang" bonding. The method employs a continuous metallized tape having individual frames, each of which includes a pattern of metal leads formed on a tape of polyimide or polyamide film. The inner ends of the metal leads can define a rectangular pattern, corresponding to a rectangular pattern of peripheral bonding pads on the top surface of the IC chip. In TAB, it is common for a "bump" to be formed on a bonding pad of the IC chip to provide solder material. An outer end of each metal lead extends from the inner end, associated with the rectangular pattern, toward the periphery of each tape frame, where it can connect to external circuitry, such as that formed on a laminate base.

There remains a need for a three-dimensional (3D) package including multiple integrated circuit (IC) chips, stacked one atop the other, on a laminate that provides a more efficient distribution of signals and of power/ground between all levels of a chip stack and of a laminate base.

SUMMARY

In an embodiment of the disclosure, a 3-dimensional hybrid package includes an integrated circuit (IC) chip stack formed on a laminate, in which the IC chip stack further includes a first IC chip and a second IC chip. The first IC chip includes: first solder bumps attached to a front side of the first IC chip, each first solder bump contacting the laminate and a first through-silicon-via (TSV) of the first IC chip; first central metal pads formed on a back side of each first TSV; first peripheral metal pads formed on the back side of the first IC chip; and first inner ends of first metal leads, embedded in a first polymer tape, contacting each first peripheral metal pad of the first IC chip and first outer ends of each first metal lead contacting the laminate; and the second IC chip includes: second solder bumps attached to a front side of the second IC chip, each second solder bump contacting a first central metal pad of the first IC chip and a second TSV of the second IC chip; second peripheral metal pads formed on a back side of each second TSV; and second inner ends of second metal leads, embedded in a second polymer tape, contacting each second peripheral metal pad of the second IC chip and second outer ends of the second metal leads contacting the laminate.

In another embodiment of the disclosure, a method of making a 3-dimensional hybrid package includes: soldering, to a laminate, a first integrated circuit (IC) chip to which first inner ends of first metal leads, embedded in a first polymer tape, are attached to first peripheral metal pads formed on a back side of the first IC chip, the first IC chip including: first solder bumps formed on a front side of the first IC chip and above first through-silicon-vias (TSVs) of the first IC chip; bending and bonding first outer ends of the first metal leads, embedded in the first polymer tape, to the laminate; soldering a second IC chip to the first IC chip, the second IC chip including: second inner ends of second metal leads, embedded in a second polymer tape, that are attached to second peripheral metal pads formed on a back side of the second IC chip, and second solder bumps formed on a front side of the second IC chip and above second TSVs of the second IC chip; and bending and bonding second outer ends of the second metal leads, embedded in the second polymer tape, to the laminate.

In yet another embodiment of the disclosure, a 3-dimensional hybrid package includes an integrated circuit (IC) chip stack formed above a laminate. The IC chip stack further includes a pair of adjacent IC chips, the pair of adjacent IC chips including one of: a first pair of adjacent IC chips of the IC chip stack further including: a first IC chip of the first pair of adjacent IC chips including: first solder bumps attached to a front side of the first IC chip, each first solder bump contacting the laminate and a first throughsilicon-via (TSV) of the first IC chip; and first central metal pads formed on a back side of each first TSV; and a second IC chip of the first pair of adjacent IC chips including: second solder bumps attached to a front side of the second IC chip, each second solder bump contacting a first central metal pad of the first IC chip and a second TSV of the second IC chip; second peripheral metal pads formed on a back side of each second TSV; second inner ends of second metal leads, embedded in a second polymer tape, contacting each second peripheral metal pad of the second IC chip; and second outer ends of the second metal leads contacting the laminate; and a second pair of adjacent IC chips of the IC chip stack further including: a first IC chip of the second pair of adjacent IC chips including: first solder bumps attached to a front side of the first IC chip, each first solder bump contacting the laminate and a first through-silicon-via (TSV) of the first IC chip; first central metal pads formed on a back side of each first TSV; first peripheral metal pads formed on the back side of the first IC chip; and first inner ends of first metal leads, embedded in a first polymer tape, contacting each first peripheral metal pad of the first IC chip and first outer ends of each first metal lead contacting the laminate; and a second IC chip of the second pair of adjacent IC chips including: second solder bumps attached to a front side of the second IC chip, each second solder bump contacting a first central metal pad of the first IC chip and a second TSV of the second IC chip.

BRIEF DESCRIPTION OF THE DRAWINGS

The embodiments herein will be better understood from the following detailed description with reference to the drawings, which are not necessarily drawn to scale and in which.

DETAILED DESCRIPTION

As stated above, there remains a need for a three-dimensional (3D) package including multiple integrated circuit (IC) chips, stacked one atop the other, on a laminate that provides a more efficient distribution of signals and of power/ground between all levels of a chip stack and of a laminate base.

Figure 1A:
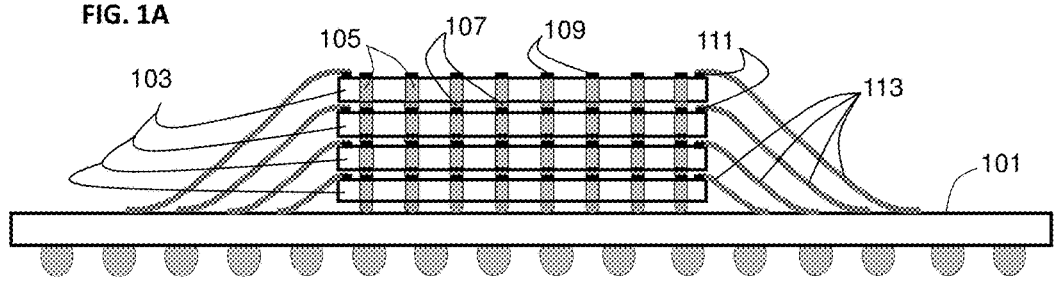
FIG. 1A illustrates a 3D hybrid package including a chip stack of four IC chips that are connected together and that each connect to a laminate in embodiments herein.
Figure 1B:
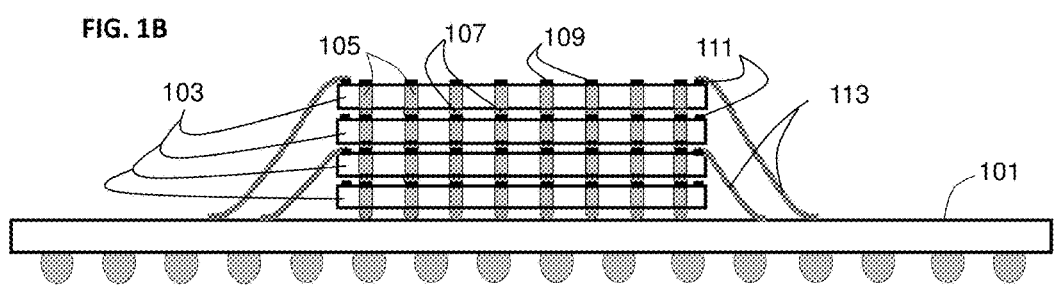
FIG. 1B illustrates a 3D hybrid package including a chip stack of four IC chips that are connected together and where two IC chips connect to a laminate in embodiments herein.
Figure 1C:
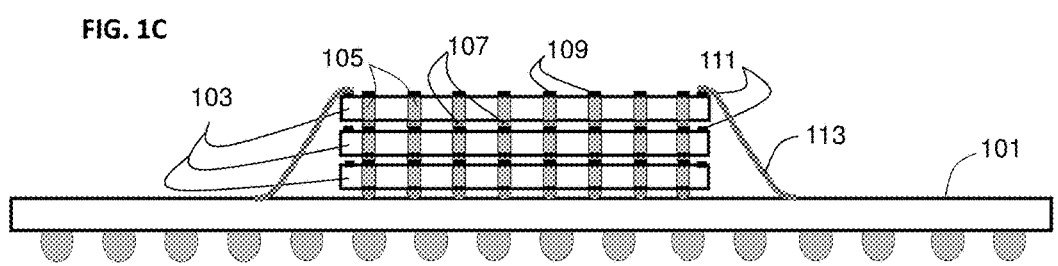
FIG. 1C illustrates a 3D hybrid package including a chip stack of three IC chips that are connected together and where one IC chip connects to a laminate in embodiments herein.

Referring to the exemplary embodiments illustrated in FIGS. 1A-C, a 3D hybrid package may include multiple IC chips 103, stacked one atop the other, on a laminate 101. Each of the IC chips 103 in the stack is flipped and includes through-silicon-vias (TSVs) 105 that extend through the silicon from the front side to the back side of the IC chip. Upon each of the TSVs 105, solder bumps 107 are formed on the front side of each of the IC chips 103, while more centrally-located metal pads 109 are formed on the back side of each TSV 105 of each IC chip 103. The solder bumps 105 may include a solder further including of any of tin and lead, lead-free tin alloys yet further including any of gold, silver, copper, bismuth, and indium, and conductive epoxies. The solder bumps 105 of the lowermost IC chip of the chip stack physically contact and electrically connect to the underlying laminate 101, such as a printed circuit board. Thus, chip-to-chip connections in the chip stack are formed by the front side solder bumps 107 of an upper IC chip contacting the metal pads 109 on the back side of a lower IC chip.

In the exemplary embodiment of FIG. 1A, each of the four IC chips 103 in the four chip stack also includes metal leads 113 of tape automated bonds that are attached to peripherally-located metal pads 111 on the back side of each of the four IC chips 103, to increase the number of electrical pathways between the laminate 101 and each of the four IC chips 103. As shown in FIG. 1A, the outer ends of metal leads 113 of the TAB process for the lowermost IC chip extend beyond the vertical sides of the chip stack and are bonded to the laminate 101 at a shortest bonding distance from the vertical sides of the chip stack, while the outer ends of metal leads 113 of the TAB process for the next most lower IC chip extend beyond the vertical sides of the chip stack and are bonded to the laminate 101 at a next most shorter bonding distance from the vertical sides of the chip stack. Thus, the level of a stacked IC chip 103 subject to the TAB process is directly related to the bonding distance of its outer ends of the metal leads 113 of the TAB process from the vertical sides of the chip stack, e.g., the topmost IC chip of the chip stack in FIG. 1A has the greatest bonding distance between the outer ends of the metal leads bonded to the laminate 101 and the vertical sides of the chip stack, while the bottommost IC chip has the shortest bonding distance between outer ends of the metal leads bonded to the laminate 101 and the vertical sides of the chip stack. Thus, chip-to-laminate connections are formed by metal leads 113 that are embedded in a polymer tape associated with each IC chip 103 and that connect the peripheral metal pads 111 on the back side of each IC chip 103 to the laminate 101.

In the exemplary embodiment of FIG. 1B, two of the four IC chips 103 in the four chip stack include metal leads 113, associated with tape automated bonding (TAB), attached to peripheral metal pads 111 on the back sides of each of the two IC chips. In this embodiment, the number of additional electrical pathways, provided by the TAB processes, between the laminate and the four chip stack is reduced, compared to the number of additional pathways in FIG. 1A. However, because two TAB processes are utilized for the four chip stack, the bonding distance of the outer ends of the metal leads 113 of the TAB process of the topmost IC chip from the vertical sides of the chip stack in FIG. 1B may be less than that of FIG. 1A, advantageously reducing the area of the 3D hybrid package on the laminate 101. Again, chip-to-chip connections in the chip stack are formed by the front side solder bumps 107 of an upper IC chip contacting the metal pads 109 on the back side of a lower IC chip, while chip-to-laminate connections are formed by metal leads 113 that are embedded in a polymer tape associated with each of the two IC chips and that connect the peripheral metal pads 111 on the back side of each of the two IC chips to the laminate 101.

Similarly, in the exemplary embodiment of FIG. 1C, only one of three IC chips 103 in a three chip stack includes metal leads 113, associated with tape automated bonding (TAB), that are attached to the peripheral metal pads 111 of the one IC chip. In this embodiment, a trade-off is made between the possible number of additional electrical pathways, provided by one TAB process, and the increasingly greater reduction of the area of the 3D hybrid package with but one TAB process.

Figure 2A:
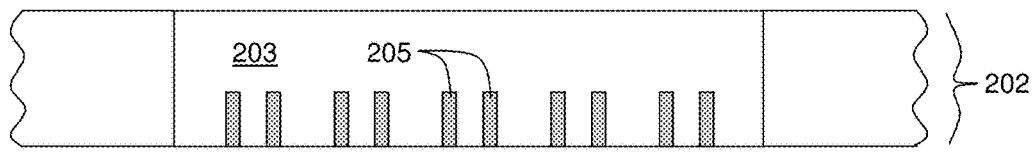
FIG. 2A illustrates a step in making a 3D hybrid including a wafer with ICs and TSVs in embodiments herein.
Figure 2B:
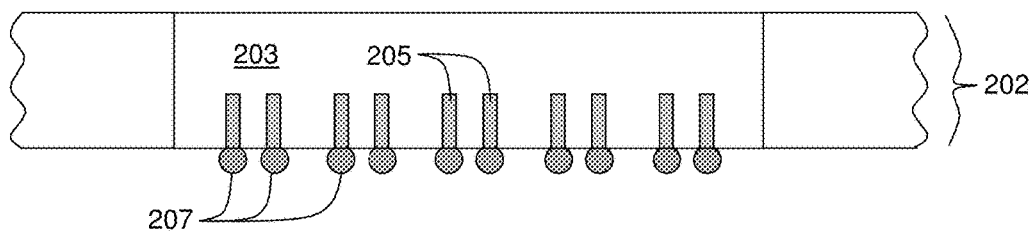
FIG. 2B illustrates a step in making a 3D hybrid including forming solder bumps on a wafer in embodiments herein.
Figure 2C:
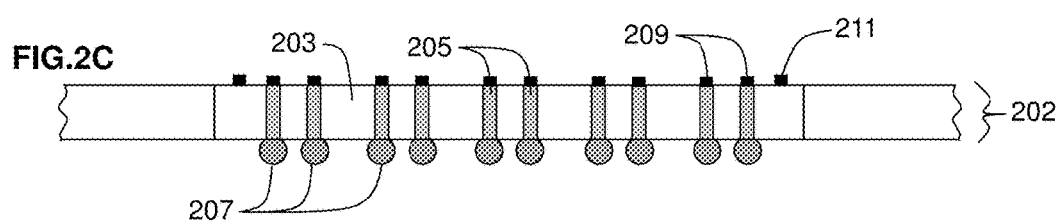
FIG. 2C illustrates a step in making a 3D hybrid including thinning a wafer to expose a back side of TSVs in embodiments herein.
Figure 2D:
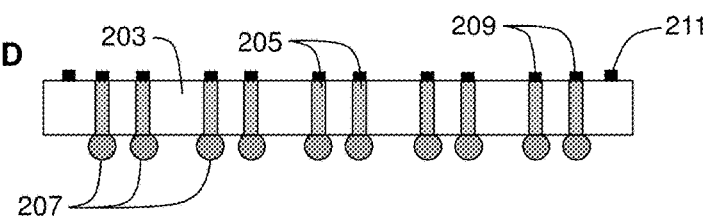
FIG. 2D illustrates a step in making a 3D hybrid including singulating IC chips from the wafer in embodiments herein.
Figure 2E:
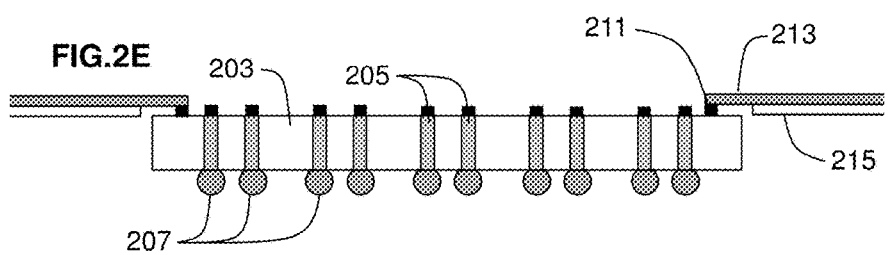
FIG. 2E illustrates a step in making a 3D hybrid including attaching metal leads, embedded in a polymer tape, to singulated IC chips in embodiments herein.

Referring to FIGS. 2A-E, the process of forming an IC chip with solder bumps 207 on the front side, TSVs 205, and more centrally-located metal pads 209 and peripheral metal pads formed on the back side of the IC chip to accommodate the TAB is described. In FIG. 2A, a wafer 202 including a number of ICs is fabricated, where each IC 203 includes a number of TSVs 205. In FIG. 2B, solder bumps 207 are formed on the front side of the wafer 202 over the TSVs 205 of each IC 203. The solder bumps 207 may include a solder further including of any of tin and lead, lead-free tin alloys yet further including any of gold, silver, copper, bismuth, and indium, and conductive epoxies. In FIG. 2C, the wafer 202 is thinned to expose the TSVs 205 on the back side of the thinned wafer. A single metallization layer is formed on the back side of the thinned wafer, including both the more centrally-located metal pads 209 on the back side of the exposed TSVs 205 and the peripheral metal pads 211, which will facilitate TAB. In FIG. 2D, the thinned wafer 201 is singulated to provide individual IC chips 203, each including solder bumps 207 formed on the front side, TSVs 205, central metal pads 209 formed on the back side of the TSVs 205, and peripheral metal pads 211 to accommodate TAB. In FIG. 2E, the inner ends of metal leads 213, supported by a polymer tape 215 of polyimide or polyamide, are bonded to the peripheral metal pads 211 on the back side of the IC chip 203.

Figure 3A:
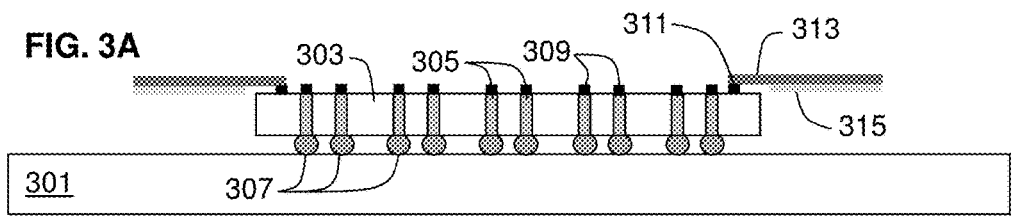
FIG. 3A illustrates a step in making a 3D hybrid including attaching a first IC chip with first tape bonds to a laminate in embodiments herein.
Figure 3B:
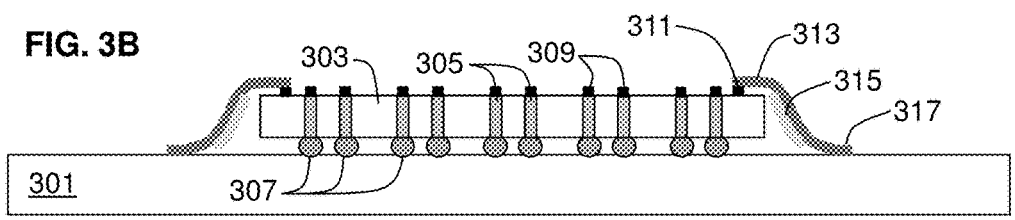
FIG. 3B illustrates a step in making a 3D hybrid including bonding the first tape bonds to the laminate in embodiments herein.
Figure 3C:
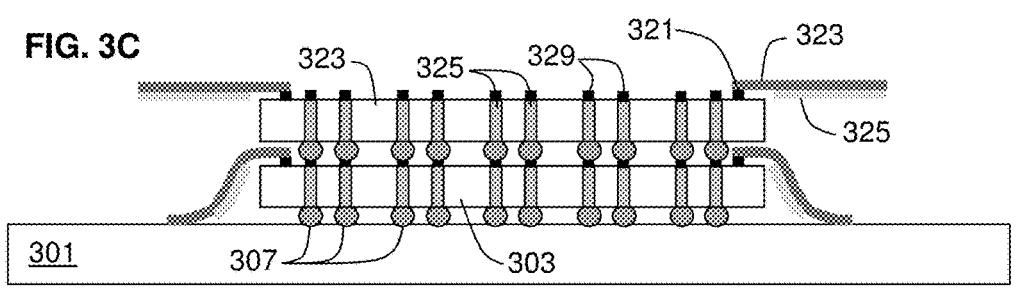
FIG. 3C illustrates a step in making a 3D hybrid including attaching a second IC chip with second tape bonds to a laminate in embodiments herein.
Figure 3D:
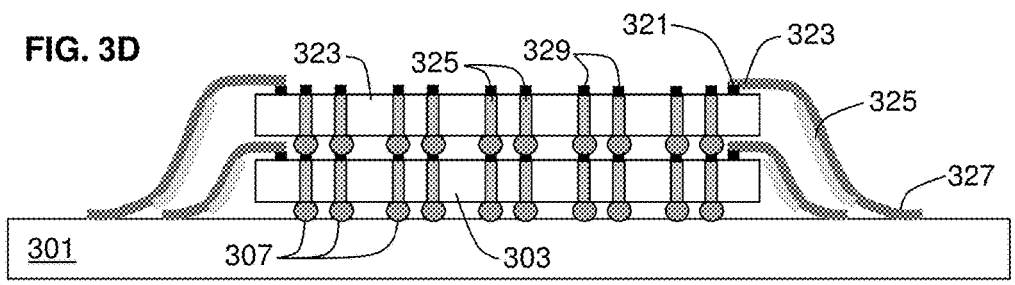
FIG. 3D illustrates a step in making a 3D hybrid including bonding the second tape bonds to the laminate in embodiments herein.

Referring to FIGS. 3A-D, the process of forming a chip stack on a laminate, where each of two adjacent IC chips includes tape automated bonds, is described. In FIG. 3A, a first IC chip 303 physically contacts and electrically connects to underlying laminate 301 by solder bumps 307, associated with corresponding TSVs 305. Metal leads 313, embedded in a polymer tape 315, are attached to peripheral metal pads 311 formed on the back side of exposed TSVs 305. In FIG. 3B, the metal leads 313, embedded in the polymer tape 315, are bent and the outer ends 317 of the metal leads 313 are simultaneously bonded to the underlying laminate 301. In FIG. 3C, the solder bumps of the second IC chip 323 physically contact and electrically connect to the central metal pads 309 of the underlying first IC chip 303 by its solder bumps. Thus, connecting the first IC chip 303 to the second IC chip 323. In FIG. 3D, the metal leads 323, embedded in polymer tape 325 and attached to the peripheral metal pads 321 on the back side of the second IC chip 315, are bent and the outer ends 327 of the metal leads 323 are simultaneously bonded to the laminate 301 at a greater distance from the vertical sides of the chip stack, when compared to the distance from the vertical sides of the chip stack of the outer ends 317 of the metal leads 313 of the tape automated bonds of the first IC chip 303. Thus, the outer ends 317 and 327 of metal leads 313 and 323, respectively, physically contact and electrically connect the first IC chip 303 and the second IC chip 323 to the laminate 301.

Figure 4A:
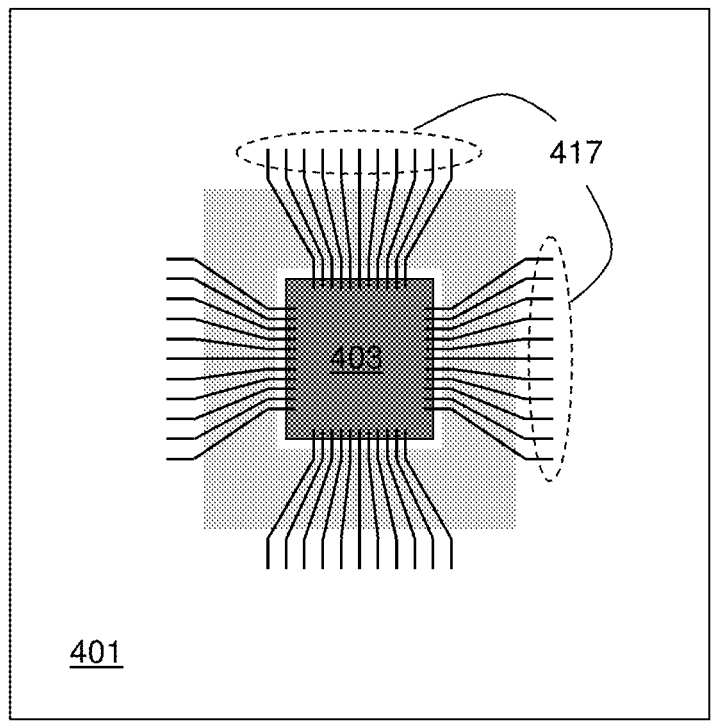
FIG. 4A illustrates a step in making a 3D hybrid showing a top view of bonding the first tape bonds to the laminate in FIG. 3B in embodiments herein.
Figure 4B:
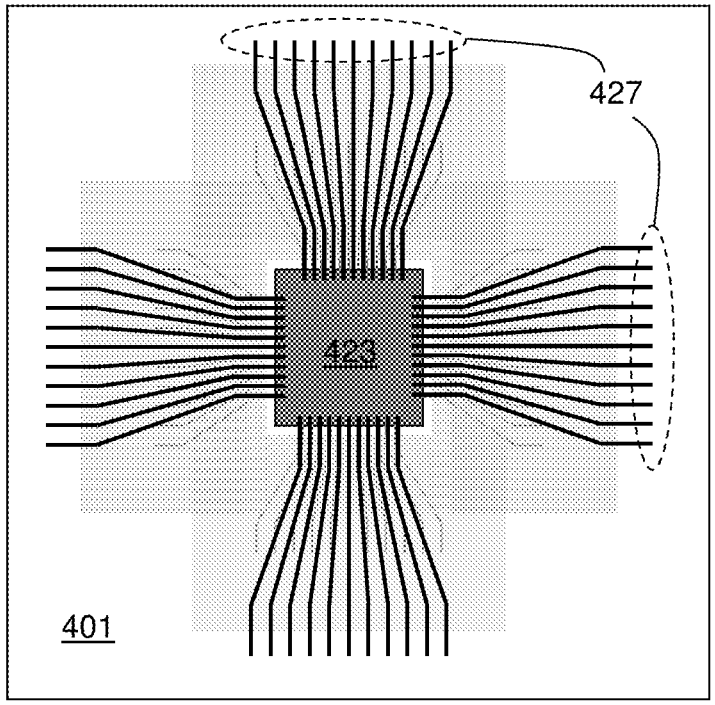
FIG. 4B illustrates a step in making a 3D hybrid showing a top view of bonding the second tape bonds to the laminate in FIG. 3D in embodiments herein.

Referring to FIGS. 4A and 4B, a top view of a first IC chip 403 automatically tape bonded to a laminate 401 is shown in FIG. 4A, while a top view of a second IC chip 423, connected to underlying first IC chip 403 by its solder bumps, is automatically tape bonded to the laminate 401 is shown in FIG. 4B. FIG. 4A illustrates outer ends 417 of the metal leads of the automated tape bonds extend from the periphery of the first chip 403 to the laminate 401 by a short distance, when compared to the outer ends 427 of the metal leads of the automated tape bonds extending from the periphery of the second chip 423 to the laminate 401 by a longer distance.

Figure 5A:
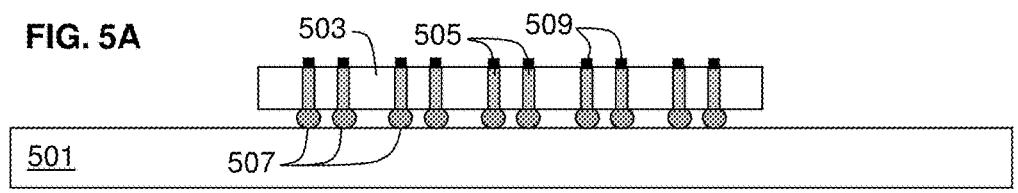
FIG. 5A illustrates a step in making a 3D hybrid including attaching a first IC chip, without tape bonds, to the laminate in embodiments herein.
Figure 5B:
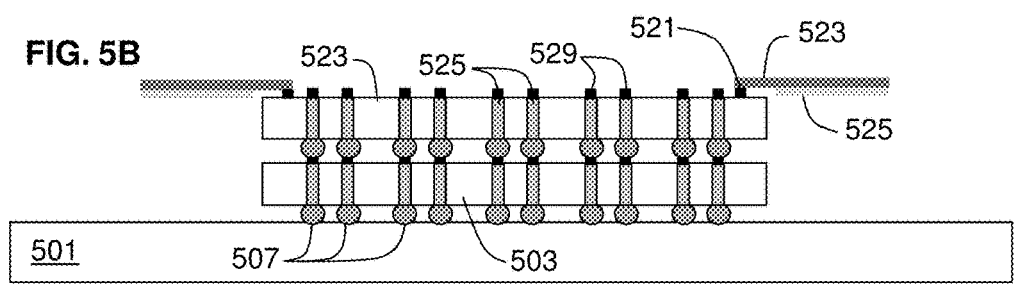
FIG. 5B illustrates a step in making a 3D hybrid including attaching an second IC chip with tape bonds on top of the first IC chip in embodiments herein.
Figure 5C:
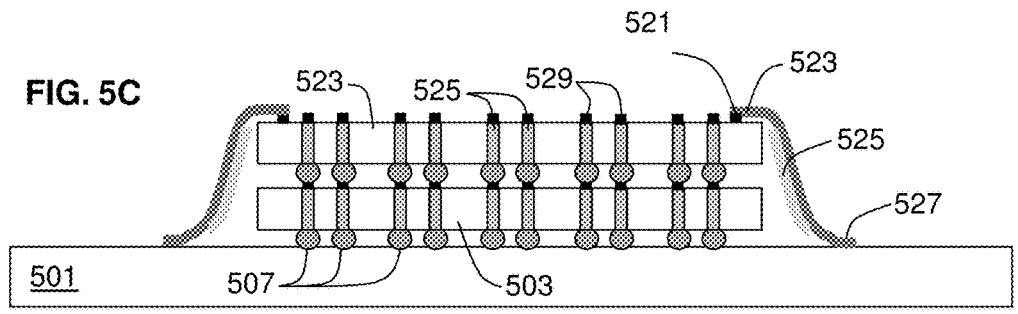
FIG. 5C illustrates a step in making a 3D hybrid including bending the tape bonds of the first IC chip to bond to the laminate in embodiments herein.

Referring to FIGS. 5A-C, the process of forming a pair of adjacent IC chips in a chip stack is described, in which the chip stack contains a first IC chip 503 that connects to a laminate 501 or an underlying IC chip (not shown) by its front side solder bumps 507 but is not tape bonded to the laminate 501, and a second IC chip 523 that physically contacts and electrically connects to more centrally-located metal pads 509 on the back side of the first IC chip 503 by its solder bumps and is tape bonded to the laminate 501. Referring to FIG. 5A, a first IC chip 503 may include solder bumps 507 that are formed on the front side over TSVs 505, which extend through the silicon from the front side to the back side, and the more centrally-located metal pads 509 formed on the back side of each of the TSVs 505, but may lack any back side peripheral metal pads that would support TAB. In contrast, FIG. 5B illustrates a second IC chip 523 that may include solder bumps formed on the front side over the TSVs 525, which extend through the silicon from the front side to the back side, more-centrally-located metal pads 529 formed on the back side of each of the TSVs 525, and peripheral metal pads 521 formed on the back side to support TAB. In addition, metal leads 523, supported by polymer tape 525, may attach to the peripheral metal pads 521 of the second IC chip 523 to accommodate tape automated bonds. In FIG. 5C, the metal leads 523, supported by the polymer tape 525, are bent and the outer ends 527 of the metal leads 523 are simultaneously bonded to the laminate 501.

Figure 6A:
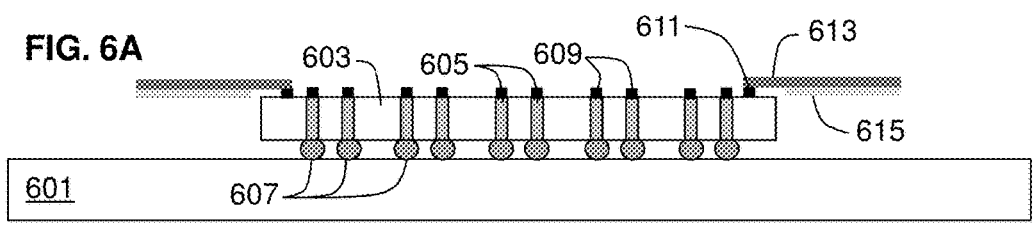
FIG. 6A illustrates a step in making a 3D hybrid including attaching a first IC chip, with tape bonds, to the laminate in embodiments herein.
Figure 6B:
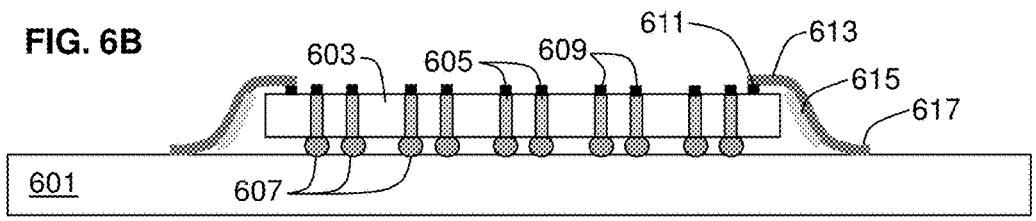
FIG. 6B illustrates a step in making a 3D hybrid including bending the tape bonds of the first IC chip to bond to the laminate in embodiments herein.
Figure 6C:
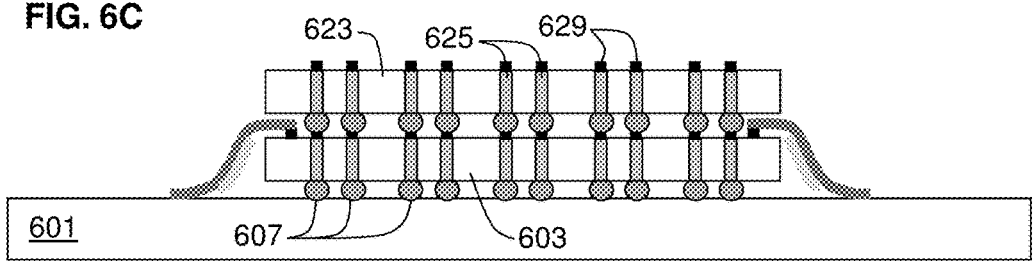
FIG. 6C illustrates a step in making a 3D hybrid including attaching a second IC chip, without tape bonds, to the first IC chip in embodiments herein.

Referring to FIGS. 6A-C, another process of forming another pair of adjacent IC chips in a chip stack is described, in which the chip stack contains a first IC chip 603 that connects to a laminate 601 or an underlying IC chip (not shown) by its front side solder bumps 607 and to the laminate 601 by metal leads 613 that connect to back side peripheral metal pads 611 of the first IC chip 603 in a TAB process, and a second IC chip 623 that physically contacts and electrically connects to more centrally-located metal pads 609 on the back side of the first IC chip 603 by its solder bumps and is not tape bonded to the laminate 601. Referring to FIG. 6A, a first IC chip 603 may include solder bumps 607 formed on the front side over the TSVs 607, which extend through the silicon from the front side to the back side, more centrally-located metal pads 609 formed on the back side of each of the TSVs 605, and peripheral metal pads 611 formed on the back side to support TAB. In addition, metal leads 613, supported by polymer tape 615, may attach to the peripheral metal pads 611 of the first IC chip 603 to accommodate tape automated bonds. The first IC chip 603 physically contacts and electrically connects to the underlying laminate 601 or to an adjacent lower level IC chip (not shown) by its solder bumps 607. In FIG. 6B, the metal leads 613, supported by the polymer tape 615, of the tape automated bonds are bent and the outer ends 617 of the metal leads 613 are simultaneously bonded to laminate 601. In contrast, FIG. 6C illustrates a second IC chip 623 that may include solder bumps formed on the front side over the TSVs 625, which extend through the silicon from the front side to the back side, and more-centrally-located metal pads 629 formed on the back side of each of the TSVs 625, but may lack any back side peripheral metal pads that would support TAB. The second IC chip 623 physically contacts and electrically connects to the underlying first IC chip 603 by its solder bumps, and does not connect directly to the laminate 601.

Figure 7:
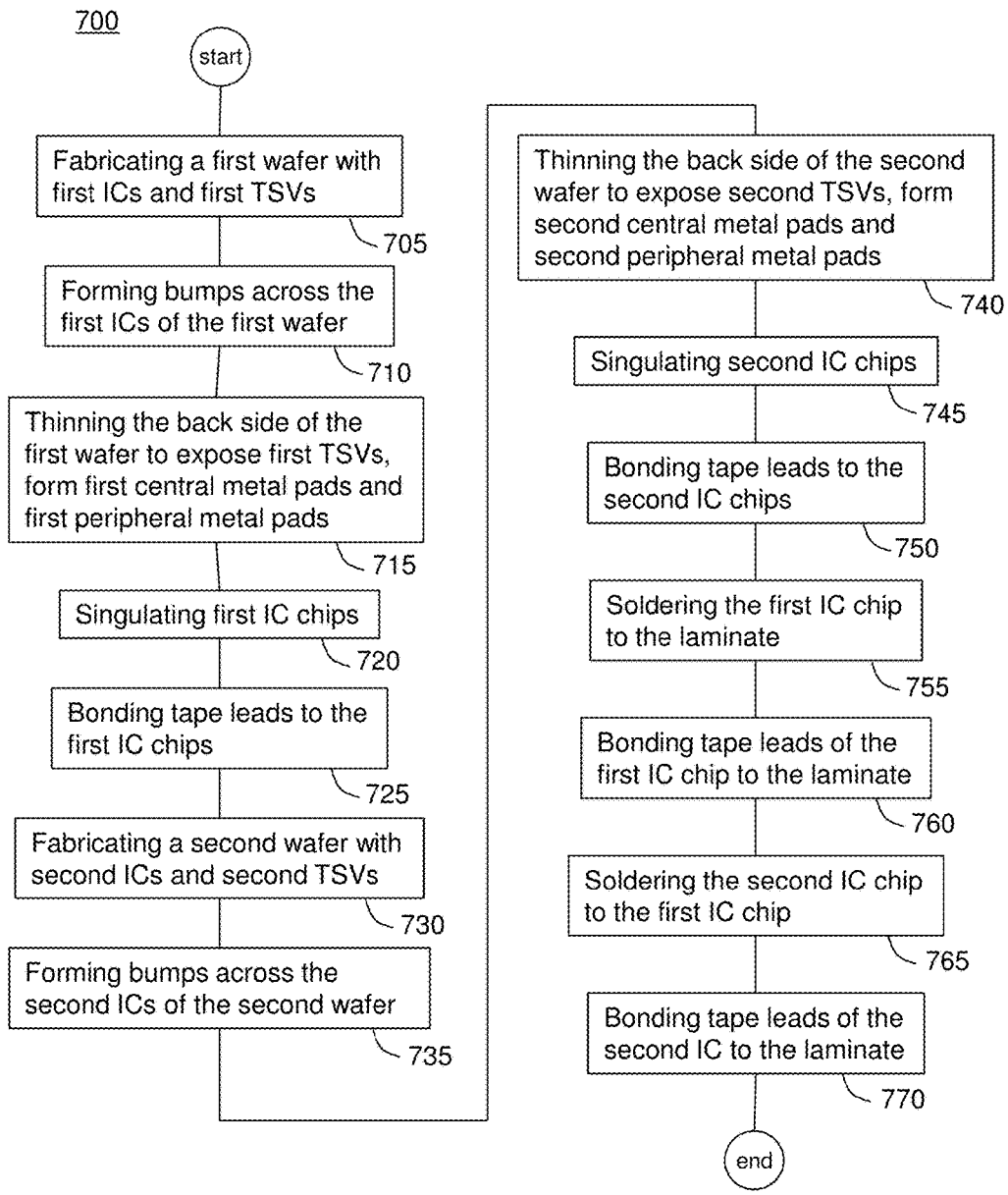
FIG. 7 illustrates a flowchart of making a 3D hybrid in embodiments herein.

Referring to FIG. 7, a method of making a three-dimensional (3D) hybrid package including a chip stack containing two adjacent IC chips with through-silicon-vias (TSVs) and tape automated bonds is described, 700. A first wafer including a number of first ICs in which each first IC includes first TSVs is fabricated, 705. First solder bumps are formed on the active side of each first IC above each first TSV across the first wafer, 710. The first wafer is thinned on its back side to expose the back side of the first TSVs of each of the first ICs, first more centrally-located metal pads are formed on each of the exposed back sides of the first TSVs, and first peripheral metal pads are formed on the back side of the first ICs, 715. The first wafer is singulated to form first IC chips, 720. Each singulated first IC chip is bonded at first inner ends of first metal leads embedded in a first circuited polymer tape, 725. Similarly, a second wafer including a number of second ICs in which each second IC includes second TSVs is fabricated, 730. Second solder bumps are formed on the active side of each second IC above each second TSV across the second wafer, 735. The second wafer is thinned on its back side to expose the back side of the second TSVs of each of the second ICs, second more centrally-located metal pads are formed on each of the exposed back sides of the second TSVs, and second peripheral metal pads are formed on the back side of the second ICs, 740. The second wafer is singulated to form second IC chips, 745. Each singulated second IC chip is bonded at second inner ends of second metal leads embedded in a second circuited polymer tape, 750.

After making the IC chips with to which the metal leads, embedded in a polymer tape, are attached to the back sides of the IC chips, the IC chips are flipped and assembled into a chip stack. A singulated first IC chip of the singulated first IC chips is soldered by its first solder bumps to a laminate, 755. The first outer ends of the first metal leads connected to the back side of the singulated first IC chip are bonded to the laminate, 760. A singulated second IC chip of the singulated second IC chips is soldered by its solder bumps to the first peripheral metal pads on the back side of the first IC chip, 765. The second outer ends of the second metal leads connected to the back side of the singulated second IC chip are bonded to the laminate, 770. The first IC and the second IC may be one of: identical circuitry, and different circuitry.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated).

As used herein, the singular forms "a", "an" and "the" are intended to include the plural forms as well, unless the context clearly indicates otherwise. It will be further understood that the terms "includes" and/or "including," when used in this specification, specify the presence of stated features, steps, operations, elements, and/or components, but do not preclude the presence or addition of one or more other features steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making a chip package, the method comprising:
　　soldering, to a laminate, a first integrated circuit (IC) chip to which first inner ends of first metal leads, embedded in a first polymer tape, are attached to first peripheral metal pads formed on a first back side of the first IC chip, wherein the first IC chip has a first center portion and a first periphery portion outside the first center portion, wherein the first peripheral metal pads are adjacent to the first back side on the first periphery portion, wherein first central metal pads are adjacent to the first back side on the first center portion, wherein the first IC chip further includes: first solder bumps formed adjacent to a first front side of the first IC chip on the first center portion; and first through silicon vias (TSVs) that extend vertically through the first center portion from the first solder bumps to the first central metal pads, and wherein the first solder bumps attach the first IC chip to the laminate;

bending and bonding first outer ends of the first metal leads, embedded in the first polymer tape, to the laminate;

soldering a second IC chip to the first IC chip, the second IC chip including: second inner ends of second metal leads, embedded in a second polymer tape, that are attached to second peripheral metal pads formed on a second back side of the second IC chip, wherein the second IC chip has a second center portion and a second periphery portion outside the second center portion, wherein the second peripheral metal pads are adjacent to the second back side on the second periphery portion, wherein second central metal pads are adjacent to the second back side on the second center portion, wherein the second IC chip further includes: second solder bumps formed adjacent to a second front side of the second IC chip on the second center portion; and second TSVs that extend vertically through the second center portion from the second solder bumps to the second central metal pads, and wherein the second solder bumps attach the second IC chip to the first IC chip; and bending and bonding second outer ends of the second metal leads, embedded in the second polymer tape, to the laminate.

2. The method of claim 1, further comprising:
initially fabricating a first wafer to include at least the first IC chip and the first TSVs; and
initially fabricating a second wafer to include at least the second IC chip and the second TSVs.

3. The method of claim 2, further comprising:
flipping the first wafer to thin a back side of the first wafer, to expose a back side of each first TSV on which is formed a first central metal pad and forming first peripheral metal pads on a back side of each first IC chip; and
flipping the second wafer to thin a back side of the second wafer, to expose a back side of each second TSV on which is formed a second central metal pad and forming second peripheral metal pads on a back side of each second IC chip.

4. The method of claim 3, further comprising:
singulating the first IC chip from the first wafer; and
singulating the second IC chips from the second wafer.

5. The method of claim 4, further comprising:
bonding the first inner ends of the first metal leads, embedded in the first polymer tape, to the first peripheral metal pads on the back side of the first IC chip; and
bonding the second inner ends of the second metal leads, embedded in the second polymer tape, to the second peripheral metal pads on the back side of the second IC chip.

6. The method of claim 1, wherein the first IC chip and the second IC chip are essentially equal size such that opposing first sidewalls of the first IC chip are vertically aligned with opposing second vertical sidewalls of the second IC chip.

7. A method of making a chip package, the method comprising:
providing a laminate;
attaching a first integrated circuit (IC) chip to the laminate, wherein the first IC chip has a first front side, a first back side opposite the first front side, a first center portion and a first periphery portion outside the first center portion, wherein the first IC chip includes: first solder bumps attached to the first front side, wherein each first solder bump contacts the laminate and a first through-silicon-via (TSV) that extends vertically through the first center portion, wherein first central metal pads are formed adjacent to the first back side on the first center portion and above first TSVs, and wherein first peripheral metal pads are formed adjacent to the first back side on the first periphery portion so as to be physically separated from the first TSVs;

attaching a second integrated circuit (IC) chip to the first IC chip to form a chip stack, wherein the second IC chip has a second front side, a second back side opposite the second front side, a second center portion and a second periphery portion outside the second center portion, wherein the second IC chip includes second solder bumps attached to the second front side, wherein each second solder bump contacts a first central metal pad of the first IC chip and a second through-silicon-via (TSV) that extends vertically through the second center portion of the second IC chip, wherein second central metal pads are formed adjacent to the second back side on the second center portion and above second TSVs, and wherein second peripheral metal pads are formed adjacent to the second back side on the second periphery portion so as to be physically separated from the second TSVs;

bonding first inner ends of first metal leads that are embedded in a first polymer tape to each first peripheral metal pad of the first IC chip and further bonding first outer ends of the first metal leads to the laminate; and bonding second inner ends of second metal leads that are embedded in a second polymer tape to each second peripheral metal pad of the second IC chip and further bonding second outer ends of the second metal leads to the laminate.

8. The method of claim 7,
the first IC chip being flipped such that the first front side corresponds to a first active side upon which the first solder bumps are formed; and
the second IC chip being flipped such that the second front side corresponds to a second active side upon which the second solder bumps are formed.

9. The method of claim 7, the first solder bumps and the second solder bumps comprising a solder further comprising of any of: tin and lead, lead-free tin alloys yet further comprising any of gold, silver, copper, bismuth, and indium, and conductive epoxies.

10. The method of claim 7, the laminate comprising a printed circuit board.

11. The method of claim 7,
the first metal leads and the second metal leads comprising any of copper, gold, and aluminum; and
the first polymer tape and the second polymer tape comprising one of polyimide and polyamide.

12. The method of claim 7, the second outer ends of the second metal leads contacting the laminate at a distance from vertical sides of the chip stack greater than that of the first outer ends of the first metal leads contacting the laminate.

13. A method of making a chip package, the method comprising:
providing a laminate; and
attaching a pair of adjacent integrated circuit (IC) chips to the laminate, the pair of adjacent IC chips comprising:
a first IC chip including: first through-silicon-vias (TSVs) that extend vertically through a first center portion of the first IC chip, wherein a first periphery portion surrounds the first center portion; first solder bumps attached to a first front side of the first IC chip, each first solder bump contacting the laminate and a first TSV; and first central metal pads formed adjacent to a first back side of the first IC chip above the first TSVs, respectively; and a second IC chip including: second TSVs that extend vertically through a second center portion of the second IC chip, wherein a second periphery portion surrounds the second center portion; second solder bumps attached to a second front side of the second IC chip, each second solder bump contacting a first central metal pad of the first IC chip and a second TSV of the second IC chip, wherein either the first IC chip has peripheral metal pads in the first periphery portion physically separated from the first TSVs or the second IC chip has peripheral metal pads in the second periphery portion physically separated from the second TSVs; and bonding inner ends of metal leads that are embedded in a polymer tape to each peripheral metal pad and outer ends of each metal lead to the laminate.

14. The method of claim 13, the first IC chip being flipped such that the first front side corresponds to a first active side upon which the first solder bumps are formed.

15. The method of claim 13, the second IC chip being flipped such that the second front side corresponds to a second active side upon which the second solder bumps are formed.

16. The method of claim 13, the first solder bumps and the second solder bumps comprising a solder further comprising of any of: tin and lead, lead-free tin alloys yet further comprising any of gold, silver, copper, bismuth, and indium, and conductive epoxies.

17. The method of claim 13, the laminate comprising a printed circuit board.

18. The method of claim 13, the metal leads comprising any of copper, gold, and aluminum.

19. The method of claim 13, the polymer tape comprising one of polyimide and polyamide.

20. The method of claim 13, wherein the first IC chip and the second IC chip are essentially equal size such that opposing first sidewalls of the first IC chip are vertically aligned with opposing second vertical sidewalls of the second IC chip.

* * * * *

UNITED STATES PATENT AND TRADEMARK OFFICE
CERTIFICATE OF CORRECTION

PATENT NO. : 9,972,606 B2  
APPLICATION NO. : 15/604803  
DATED : May 15, 2018  
INVENTOR(S) : Graf et al.

Page 1 of 1

It is certified that error appears in the above-identified patent and that said Letters Patent is hereby corrected as shown below:

On the Title Page

Item (71) should read:  
(71) Applicant: GLOBALFOUNDRIES INC., Grand Cayman (KY)

Signed and Sealed this  
Twenty-sixth Day of June, 2018

Andrei Iancu  
*Director of the United States Patent and Trademark Office*